US012666550B2

(12) United States Patent
Jeon et al.

(10) Patent No.: US 12,666,550 B2
(45) Date of Patent: Jun. 23, 2026

(54) CIRCUIT BOARD MODULE AND ELECTRONIC DEVICE INCLUDING THE SAME

(71) Applicant: SAMSUNG ELECTRONICS CO., LTD., Suwon-si (KR)

(72) Inventors: Jinhwan Jeon, Suwon-si (KR); Kwangho Jung, Suwon-si (KR); Chihyun Cho, Suwon-si (KR); Sangwon Ha, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 183 days.

(21) Appl. No.: 18/373,776

(22) Filed: Sep. 27, 2023

(65) Prior Publication Data

US 2024/0098912 A1     Mar. 21, 2024

Related U.S. Application Data

(63) Continuation of application No. PCT/KR2023/014911, filed on Sep. 26, 2023.

(30) Foreign Application Priority Data

Sep. 28, 2022     (KR) ........................ 10-2022-0123102
Oct. 31, 2022     (KR) ........................ 10-2022-0142179

(51) Int. Cl.
H05K 5/00         (2025.01)
H05K 1/11         (2006.01)
          (Continued)

(52) U.S. Cl.
CPC ........... H05K 5/0069 (2013.01); H05K 1/111 (2013.01); H05K 1/181 (2013.01); H05K 3/0044 (2013.01);
          (Continued)

(58) Field of Classification Search
CPC ....... G06F 1/163; G06F 1/1656; G02B 27/01; G02C 11/10; H05K 5/0069; H05K 1/11;
          (Continued)

(56)          References Cited

U.S. PATENT DOCUMENTS 10,204,869 B2     2/2019  Jeong et al.
11,538,773 B2     12/2022  Hong et al.
          (Continued)

FOREIGN PATENT DOCUMENTS

JP          2000263576 A     9/2000
JP          2018041899 A  *  3/2018   ............. H01L 23/60
          (Continued)

OTHER PUBLICATIONS

Machine Translation for JP2018041899A (Year: 2025).*
          (Continued)

*Primary Examiner* — Sagar Shrestha
*Assistant Examiner* — Peter Krim
(74) *Attorney, Agent, or Firm* — CANTOR COLBURN LLP

(57)          ABSTRACT

An electronic device includes a housing, a circuit board disposed within the housing, a first component and a second component disposed on one surface of the circuit board, a shielding mold disposed on the one surface of the circuit board to cover top and side surfaces of the first component, and an open structure disposed on the one surface of the circuit board to surround a side surface of the second component. In the open structure, a top portion is opened and exposes a part of the second component or the circuit board, an inner surface is spaced apart from the second component, and an outer surface contacts the shielding mold.

15 Claims, 11 Drawing Sheets

(51) Int. Cl.

| | |
|---|---|
| *H05K 1/181* | (2026.01) |
| *H05K 3/00* | (2006.01) |
| *H05K 3/28* | (2006.01) |
| *H05K 3/341* | (2026.01) |

(52) U.S. Cl.
CPC ............ *H05K 3/284* (2013.01); *H05K 3/341* (2013.01); *H05K 5/0086* (2013.01); *H05K 2201/09372* (2013.01); *H05K 2201/10007* (2013.01)

(58) Field of Classification Search
CPC ...... H05K 1/111; H05K 1/181; H05K 3/0044; H05K 3/28; H05K 3/284; H05K 3/34; H05K 3/341; H05K 5/0086; H05K 2201/09372; H04M 1/0277; H01L 25/065; H01L 23/552; H01L 23/498; H01L 23/31; B29D 12/02
See application file for complete search history.

(56) References Cited

U.S. PATENT DOCUMENTS

| | | |
|---|---|---|
| 2010/0207257 A1 | 8/2010 | Lee |
| 2012/0008288 A1 | 1/2012 | Tsukamoto et al. |
| 2012/0320558 A1 | 12/2012 | Foster et al. |
| 2013/0089992 A1 | 4/2013 | Yang |
| 2017/0207524 A1 | 7/2017 | Cardinali et al. |
| 2018/0090449 A1 | 3/2018 | Jeong et al. |
| 2018/0233458 A1* | 8/2018 | Jeong .................... H10W 42/20 |
| 2019/0310687 A1* | 10/2019 | Hong .................... G06F 1/1656 |
| 2019/0348372 A1 | 11/2019 | Jun |
| 2020/0137893 A1 | 4/2020 | Nomura et al. |
| 2020/0286839 A1* | 9/2020 | Jang .................... H01L 23/3675 |
| 2020/0367393 A1 | 11/2020 | Mun et al. |
| 2021/0057299 A1* | 2/2021 | Hong ................. H01L 25/0655 |
| 2021/0066244 A1* | 3/2021 | Kim ........................ H01L 25/50 |

FOREIGN PATENT DOCUMENTS

| | | |
|---|---|---|
| KR | 20120005376 A | 1/2012 |
| KR | 20130038503 A | 4/2013 |
| KR | 20180032985 A | 4/2018 |
| KR | 20190092085 A | 8/2019 |
| KR | 20190116887 A | 10/2019 |
| KR | 20190129650 A | 11/2019 |
| KR | 20200003050 A | 1/2020 |
| KR | 20200110289 A | 9/2020 |
| KR | 20220014685 A | 2/2022 |

OTHER PUBLICATIONS

International Search Report and Written Opinion mailed Jan. 3, 2024 for PCT/KR2023/014911.
The extended European search report for EP Application No. 23873153.3 mailed on Sep. 23, 2025.
European Office Action for EP Application No. 23873153.3 mailed on Mar. 10, 2026.

\* cited by examiner

CIRCUIT BOARD MODULE AND ELECTRONIC DEVICE INCLUDING THE SAME

CROSS-REFERENCE TO RELATED APPLICATIONS

This application is a continuation application of International Application No. PCT/KR2023/014911, filed on Sep. 26, 2023, which claims priority to Korean Patent Application No. 10-2022-0123102, filed on Sep. 28, 2022, in the Korean Intellectual Property Office, and which claims priority to Korean Patent Application No. 10-2022-0142179, filed on Oct. 31, 2022, in the Korean Intellectual Property Office, the disclosures of which are incorporated by reference herein in their entireties.

TECHNICAL FIELD

The disclosure relates to a circuit board module and an electronic device including the same.

BACKGROUND ART

Owing to the remarkable development of information and communication technology and semiconductor technology, various electronic devices have been increasingly proliferated and used. Especially, electronic devices are under development for use in communication while being carried.

An electronic device may refer to a device performing a specific function according to a loaded program, such as a home appliance, an electronic notebook, a portable multimedia player, a mobile communication terminal, a tablet personal computer (PC), a video/audio device, a desktop/laptop computer, or a car navigation device. For example, these electronic devices may output stored information as sound or an image. As the integration degree of electronic devices increases and ultra-high-speed, large-capacity wireless communication becomes commonplace, a single electronic device such as a mobile communication terminal may be equipped with various functions. For example, not only a communication function but also an entertainment function such as games, a multimedia function such as music/video playback, a communication and security function such as mobile banking, schedule management, and an electronic wallet function are integrated into one electronic device. Such electronic devices are miniaturized so that users may conveniently carry them.

DISCLOSURE OF INVENTION

An electronic device according to an embodiment of the disclosure includes a housing, a circuit board disposed within the housing, a first component and a second component disposed on one surface of the circuit board, a shielding mold disposed on the one surface of the circuit board to cover top and side surfaces of the first component, and an open structure disposed on the one surface of the circuit board to surround a side surface of the second component. In the open structure, a top portion is opened and exposes a part of the second component or the circuit board, an inner surface is spaced apart from the second component, and an outer surface is disposed to contact the shielding mold.

A method of manufacturing a circuit board module according to an embodiment of the disclosure includes a process of preparing a circuit board, a metal mask, and solder paste and soldering the solder paste on a part of the circuit board, a mounting and reflow process of disposing a plurality of components and an open structure on the circuit board, a full molding process of disposing a mold frame on the circuit board and injecting a mold into the mold frame, and a process of removing the mold frame.

However, the problems to be solved in the disclosure are not limited to the above-described problem, and may be extended in various ways without departing from the spirit and scope of the disclosure.

MODE FOR THE INVENTION

Figure 1:
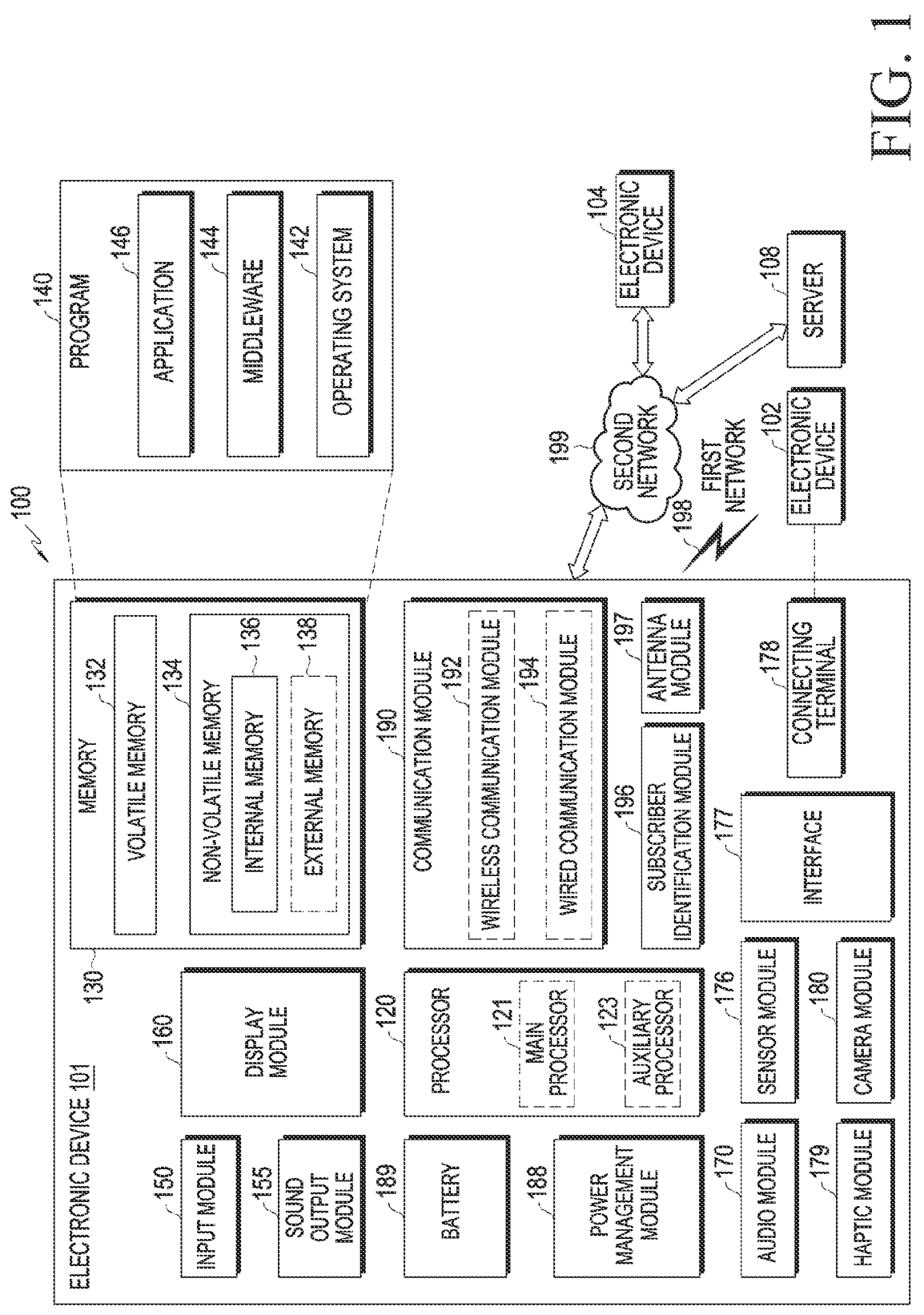
FIG. 1 is a block diagram illustrating an electronic device in a network environment according to an embodiment of the disclosure.

An electronic device according to embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C", may include any one of, or all possible combinations of the items enumerated together in a corresponding one of the phrases. As used herein, such terms as "$1^{st}$" and "$2^{nd}$", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

According to embodiments, each component (e.g., a module or a program) of the above-described components may include a single entity or multiple entities, and some of the multiple entities may be separately disposed in different components. According to embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to embodiments, operations performed by the module, the program, or another component may be carried out sequentially, in parallel, repeatedly, or heuristically, or one or more of the operations may be executed in a different order or omitted, or one or more other operations may be added.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an embodiment, at least one of the components (e.g., the connecting terminal 178) may be omitted from the electronic device 101, or one or more other components may be added in the electronic device 101. In an embodiment, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beamforming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to an embodiment, the antenna module 197 may form an mmWave antenna module. According to an embodiment, the mmWave antenna module may include a printed circuit board, a RFIC disposed on a first surface (e.g., the bottom surface) of the printed circuit board, or adjacent to the first surface and capable of supporting a specified high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the specified high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
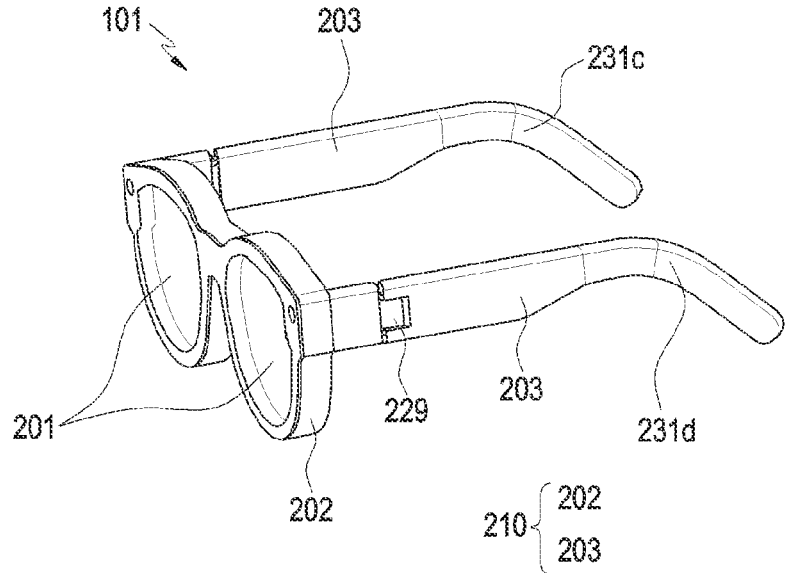
FIG. 2 is a perspective view illustrating a wearable electronic device according to an embodiment of the disclosure.

FIG. 2 is a perspective view illustrating a wearable electronic device according to an embodiment.

Referring to FIG. 2, an embodiment of the electronic device 101 may be a wearable electronic device in the form of glasses, and a user may visually recognize an object or an environment around the user, while wearing the electronic device 101. For example, the electronic device 101 may be a head mounted display (HMD) or smart glasses capable of providing an image directly in front of the user's eyes. The configuration of the electronic device 101 illustrated FIG. 2 may be wholly or partially identical to that of the electronic device 101 illustrated in FIG. 1.

According to embodiments, the electronic device 101 may include a housing 210 that forms an exterior of the electronic device 101. The housing 210 may provide a space in which components of the electronic device 101 may be arranged. For example, the housing 210 may include a lens frame 202 and at least one wearing member 203.

According to an embodiment, the electronic device 101 may include at least one display member 201 capable of providing visual information to a user. For example, the display member 201 may include a module equipped with a lens, a display, a waveguide, and/or a touch circuit. According to an embodiment, the display member 201 may be formed to be transparent or semi-transparent. According to an embodiment, the display member 201 may include translucent glass or a window member having a light transmittance which is adjustable by adjusting a color concentration. According to an embodiment, a pair of display members 201 may be provided and disposed to correspond to the left eye and the right eye of the user, respectively, while the electronic device 101 is worn on the user's body.

According to an embodiment, the lens frame 202 may accommodate at least a part of the display member 201. For example, the lens frame 202 may surround at least a part of an edge of the display member 201. According to an embodiment, the lens frame 202 may position at least one of the display members 201 to correspond to the user's eye. According to an embodiment, the lens frame 202 may be in the form of a rim of a general eyeglass structure. According to an embodiment, the lens frame 202 may have at least one closed curved shape surrounding the display member 201.

According to an embodiment, the wearing member 203 may extend from the lens frame 202. For example, the wearing member 203 may extend from an end of the lens frame 202 and be supported or positioned on the user's body (e.g., an ear), together with the lens frame 202. According to an embodiment, the wearing member 203 may be rotatably coupled with the lens frame 202 through a hinge structure 229. According to an embodiment, the wearing member 203 may include an inner surface 231c configured to face the user's body and an outer surface 231d opposite to the inner surface 231c.

According to an embodiment, the electronic device 101 may include the hinge structure 229 configured to fold the wearing member 203 with respect to the lens frame 202. The hinge structure 229 may be disposed between the lens frame 202 and the wearing member 203. In a state where the electronic device 101 is taken off, the user may carry or keep the electronic device 101 by folding the wearing member 203 to partially overlap with the lens frame 202.

Figure 3:
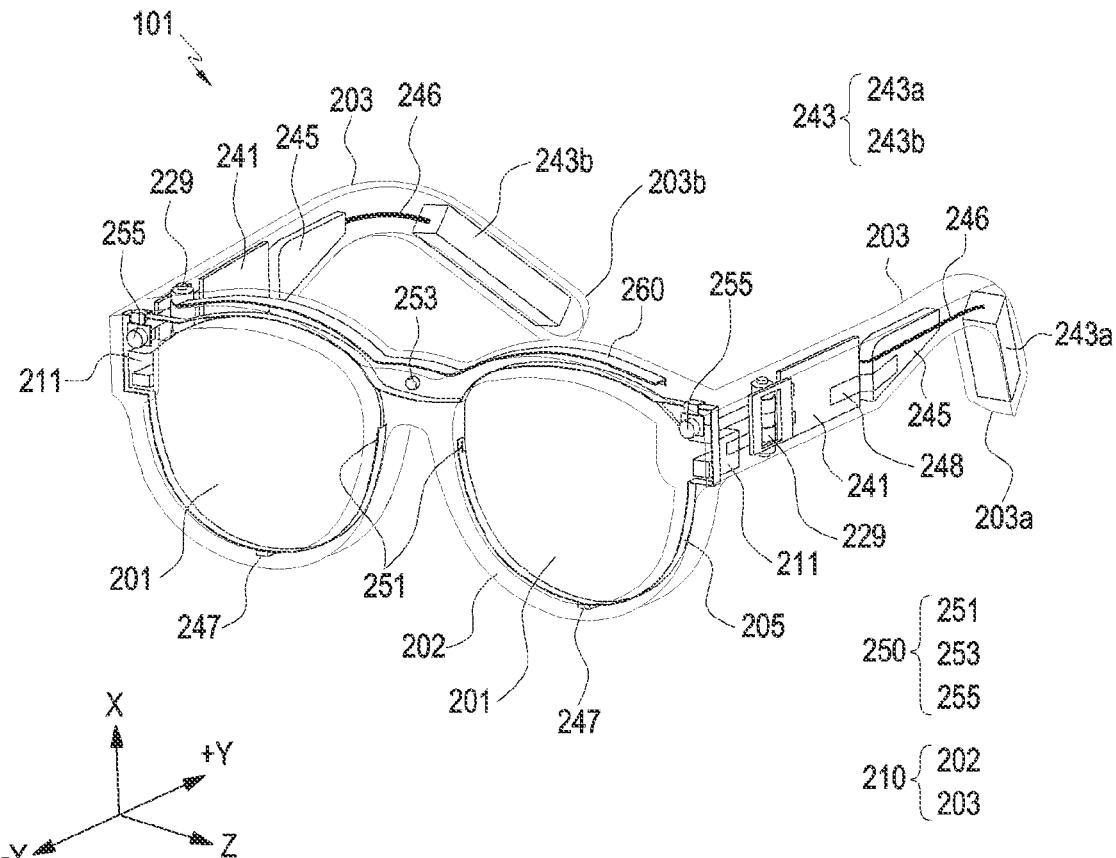
FIG. 3 is a perspective view illustrating an internal configuration of an electronic device according to an embodiment of the disclosure.

FIG. 3 is a perspective view illustrating an internal configuration of an electronic device according to an embodiment of the disclosure.

Figure 4:
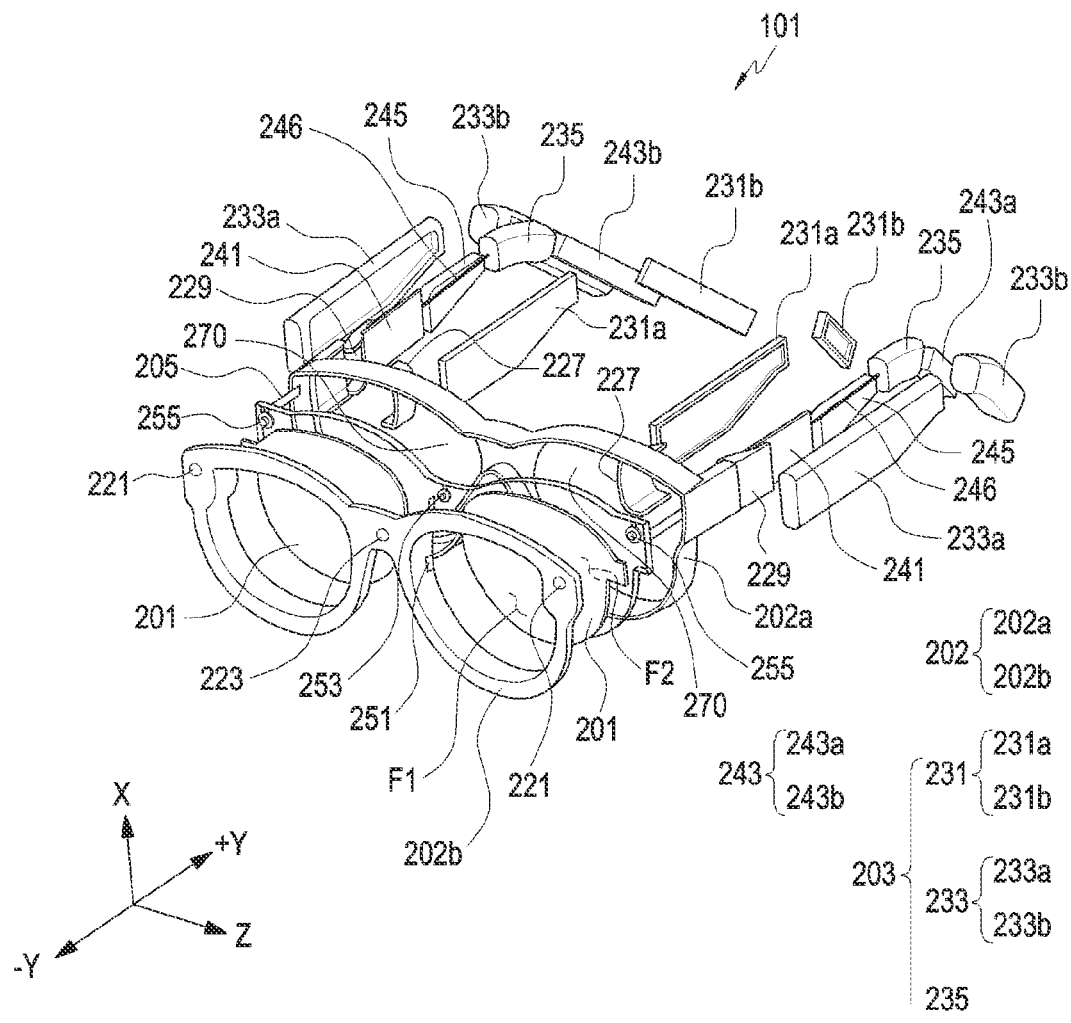
FIG. 4 is an exploded perspective view illustrating an electronic device according to an embodiment of the disclosure.

FIG. 4 is an exploded perspective view illustrating an electronic device according to an embodiment of the disclosure.

Referring to FIGS. 3 and 4, an embodiment of the electronic device 101 may include components (e.g., at least one circuit board 241 (e.g., a printed circuit board (PCB), a printed board assembly (PBA), a flexible PCB (FPCB), or a rigid-flexible PCB (RFPCB)) accommodated in the housing 210, at least one battery 243, at least one speaker module 245, at least one power transfer structure 246, and a camera module 250). The configuration of the housing 210 illustrated in FIGS. 3 and 4 may be wholly or partially identical to those of the display member 201, the lens frame 202, the wearing member 203, and the hinge structure 229 illustrated in FIG. 2. The structure of FIGS. 3 and 4 may be selectively combined with the structure of FIG. 2.

According to embodiments, the electronic device 101 may obtain and/or recognize a visual image of an object or an environment in a direction (e.g., a –Y direction) in which the user sees or the electronic device 101 faces, using the camera module 250 (e.g., the camera module 180 of FIG. 1), and receive information about the object or the environment from an external electronic device (e.g., the electronic device 102 or 104, or the server 108) through a network (e.g., the first network 198 or the second network 199 of FIG. 1). In an embodiment, the electronic device 101 may provide the received information about the object or the environment to the user in an acoustic or visual form. The electronic device 101 may provide the received information about the object or the environment in a visual form to the user through the display member 201, using a display module (e.g., the display module 160 of FIG. 1). For example, the electronic device 101 may implement augmented reality (AR) by visually implementing the information about the object or the environment and combining the information with a real image of a surrounding environment of the user.

According to embodiments, the display member 201 may include a first surface F1 facing a direction (e.g., a –Y direction) from which external light is incident and a second surface F2 facing a direction (e.g., a +Y direction) opposite to the first surface F1. In a state where the user wears the electronic device 101, at least a part of light or an image incident through the first surface F1 may be introduced to the left eye and/or the right eye of the user through the second surface F2 of the display member 201 disposed to face the left eye and/or the right eye of the user.

According to embodiments, the lens frame 202 may include at least two frames. For example, the lens frame 202 may include a first frame 202a and a second frame 202b. According to an embodiment, when the user wears the electronic device 101, the first frame 202a may be a part facing the user's face, and the second frame 202b may be part of the lens frame 202 spaced apart from the first frame 202a in a gaze direction (e.g., the –Y direction) of the user.

According to embodiments, a light output module 211 may provide an image and/or a video to the user. For example, the light output module 211 may include a display panel (not shown) capable of outputting an image, and a lens (not shown) corresponding to the user's eye and guiding the image to the display member 201. For example, the user may obtain an image output from the display panel of the light output module 211 through the lens of the light output module 211. According to embodiments, the light output module 211 may include a device configured to display various pieces of information. For example, the light output module 211 may include at least one of a liquid crystal display (LCD), a digital mirror device (DMD), a liquid crystal on silicon (LCoS), or an organic light emitting diode (OLED), or a micro light emitting diode (micro LED). According to an embodiment, when the light output module 211 and/or the display member 201 includes one of an LCD, a DMD, and an LCoS, the electronic device 101 may include a light source that radiates light to the output module 211 and/or a display area of the display member 201. According to another embodiment, when the light output module 211 and/or the display member 201 includes one of an OLED and a micro LED, the electronic device 101 may provide a virtual image to the user without including a separate light source.

According to embodiments, at least a part of the light output module 211 may be disposed in the housing 210. For example, light output modules 211 may be disposed in wearing members 203 or the lens frame 202 to correspond to the user's right eye and left eye, respectively. According to an embodiment, the light output module 211 may be connected to the display member 201 and provide an image to the user through the display member 201. For example, an image output from the light output module 211 may be incident on the display member 201 through an input optical member located at one end of the display member 201 and radiated toward the user's eye through a waveguide and an output optical member located in at least a part of the display member 201. According to an embodiment, the waveguide may be made of glass, plastic, or a polymer, and include a nano-pattern, for example, a polygonal or curved grating structure, formed on one surface inside or outside the waveguide. According to an embodiment, the waveguide may include at least one of at least one diffractive element (e.g., a diffractive optical element (DOE) or a holographic optical element (HOE)) or a reflective element (e.g., a reflective mirror).

According to embodiments, the circuit board 241 may include components to drive the electronic device 101. For example, the circuit board 241 may include at least one integrated circuit (IC) chip, and at least one of the processor 120, the memory 130, the power management module 188, or the communication module 190 illustrated in FIG. 1 may be disposed on the IC chip. According to an embodiment, the circuit board 241 may be disposed inside the wearing member 203 of the housing 210. According to an embodiment, the circuit board 241 may be electrically connected to the battery 243 through the power transfer structure 246. According to an embodiment, the circuit board 241 may be connected to a flexible printed circuit board (FPCB) 205 and transmit an electrical signal to electronic components (e.g., the light output module 211, the camera module 250, and a light emitter of the electronic device) through the FPCB 205. According to an embodiment, the circuit board 241 may be an interposer board.

According to various embodiments, the FPCB 205 may extend from the circuit board 241 across the hinge structure 229 into the lens frame 202, and may be disposed at least a part of the circumference of the display member 201 inside the lens frame 202.

According to embodiments, the battery 243 (e.g., the battery 189 of FIG. 1) may be electrically connected to components (e.g., the light output module 211, the circuit board 241, the speaker module 245, a microphone module 247, and/or the camera module 250) of the electronic device 101, and supply power to the components of the electronic device 101.

According to an embodiment, at least a part of the battery 243 may be disposed in the wearing member 203. According to an embodiment, the battery 243 may be disposed adjacent to ends 203a and 203b of wearing members 203. For example, the battery 243 may include a first battery 243a disposed at a first end 203a of the at least one wearing member 203 and a second battery 243b disposed at a second end 203b of the at least one wearing member 203.

According to various embodiments, the speaker module 245 (e.g., the audio module 170 or the sound output module 155 of FIG. 1) may convert an electrical signal into a sound. At least a part of the speaker module 245 may be disposed inside the wearing member 203 of the housing 210. According to an embodiment, the speaker module 245 may be located inside the wearing member 203 to correspond to the user's ear. According to an embodiment (e.g., FIG. 3), the speaker module 245 may be disposed on the circuit board 241. For example, the speaker module 245 may be disposed between the circuit board 241 and an inner case (e.g., an inner case 231 of FIG. 4). According to an embodiment, the speaker module 245 may be disposed close to the circuit board 241. For example, the speaker module 245 may be disposed between the circuit board 241 and the battery 243.

According to an embodiment, the electronic device 101 may include a connecting member 248 connected to the speaker module 245 and the circuit board 241. The connecting member 248 may transmit at least a part of a sound and/or a vibration generated from the speaker module 245 to the circuit board 241. According to an embodiment, the connecting member 248 may be integrally formed with the speaker module 245. For example, a portion extending from a speaker frame of the speaker module 245 may be interpreted or defined as the connecting member 248. According to an embodiment, the connecting member 248 may be omitted. For example, in an embodiment where the speaker module 245 is disposed on the circuit board 241, the connecting member 248 may be omitted.

According to embodiments, the power transfer structure 246 may transfer power from the battery 243 to an electronic component (e.g., the light output module 211) of the electronic device 101. For example, the power transfer structure 246 may be electrically connected to the battery 243 and/or the circuit board 241, and the circuit board 241 may transfer power received through the power transfer structure 246 to the light output module 211.

According to embodiments, the power transfer structure 246 may be configured to transfer power. For example, the power transfer structure 246 may include an FPCB or a wire. For example, the wire may include a plurality of cables (not shown). In various embodiments, the shape of the power transfer structure 246 may be modified in various manners in consideration of the number and/or type of the cables.

According to embodiments, the microphone module 247 (e.g., the input module 150 and/or the audio module 170 of FIG. 1) may convert a sound into an electrical signal. According to an embodiment, the microphone module 247 may be disposed on at least a part of the lens frame 202. For example, at least one microphone module 247 may be disposed at a lower end (e.g., in a direction toward the –X axis) and/or at an upper end (e.g., in a direction toward the X axis) of the electronic device 101. According to embodiments, the electronic device 101 may more clearly recognize the user's voice, using voice information (e.g., sound) obtained from the at least one microphone module 247. For example, the electronic device 101 may distinguish voice information from ambient noise based on the obtained voice information and/or additional information (e.g., low-frequency vibration of the user's skin and bones). For example, the electronic device 101 may perform a function (e.g., noise cancellation) of clearly recognizing the user's voice and reducing ambient noise.

According to an embodiment, the camera module 250 may capture a still image and/or a video. The camera module 250 may include at least one of a lens, at least one image sensor, an image signal processor, or a flash. According to an embodiment, the camera module 250 may be disposed inside the lens frame 202 and disposed around the display member 201.

According to embodiments, the camera module 250 may include at least one first camera module 251. According to an embodiment, the first camera module 251 may photograph the user's eye (e.g., a pupil) or the trajectory of a gaze. For example, the first camera module 251 may photograph a reflection pattern of light emitted from the light emitter to the user's eye. For example, the light emitter may emit light in an infrared (IR) band for tracking the trajectory of the gaze using the first camera module 251. For example, the light emitter may include an IR LED. According to an embodiment, a processor (e.g., the processor 120 of FIG. 1) may adjust the position of the virtual image so that the virtual image projected on the display member 201 corresponds to the gaze direction of the user's pupil. According to an embodiment, the first camera module 251 may include a global shutter (GS)-type camera, and the user's eye or the trajectory of the gaze may be traced using a plurality of first camera modules 251 of the same standard and/or performance.

According to various embodiments, the first camera module 251 may periodically or aperiodically transmit information (e.g., trajectory information) related to the trajectory of the user's eye or gaze to the processor (e.g., the processor 120 of FIG. 1). According to another embodiment, when the first camera module 251 detects that the user's gaze has changed based on the trajectory information (e.g., when the eye moves more than a reference value with the head stationary), the first camera module 251 may transmit the trajectory information to the processor.

According to embodiments, the camera module 250 may include a second camera module 253. According to an embodiment, the second camera module 253 may capture an external image. According to an embodiment, the second camera module 253 may be a GS-type camera or a rolling shutter (RS)-type camera. According to an embodiment, the second camera module 253 may capture an external image through a second optical hole 223 defined or formed in the second frame 202b. For example, the second camera module 253 may include a high-resolution color camera, and may be a high resolution (HR) or photo video (PV) camera. Further, the second camera module 253 may provide an auto focus (AF) function and an optical image stabilizer (OIS) function.

According to embodiments, although not shown, the electronic device 101 may include a flash (not shown) located adjacent to the second camera module 253. For example, the flash (not shown) may provide light to increase an ambient brightness (e.g., illuminance) of the electronic device 101, when the second camera module 253 obtains an external image, and reduce difficulty in obtaining an image, caused by a dark environment, mixture of various light sources, and/or light reflection.

According to embodiments, the camera module 250 may include at least one third camera module 255. According to an embodiment, the third camera module 255 may photograph a user motion through a first optical hole 221 defined or formed in the lens frame 202. For example, the third camera module 255 may photograph a user gesture (e.g., hand gesture). Third camera modules 255 and/or first optical holes 221 may be defined or formed respectively at opposing side ends of the lens frame 202 (e.g., the second frame 202b), for example, in the X direction. According to an embodiment, the third camera module 255 may be a GS-type camera. For example, the third camera module 255 may provide 360-degree spatial (e.g., omnidirectional) recognition, position recognition, and/or movement recognition with a camera supporting 3 degrees of freedom (3DoF) or 6 degrees of freedom (6DOF). According to an embodiment, the third camera module 255 may use a plurality of GS-type cameras of the same standard and performance as a stereo camera to perform a simultaneous localization and mapping (SLAM) function and a user movement recognition function. According to an embodiment, the third camera module 255 may include an IR camera (e.g., a time of flight (TOF) camera or a structured light camera). For example, the IR camera may operate as at least a part of a sensor module (e.g., the sensor module 176 of FIG. 1) for detecting a distance to a subject.

According to an embodiment, at least one of the first camera module 251 or the third camera module 255 may be replaced with a sensor module (e.g., the sensor module 176 of FIG. 1). For example, the sensor module may include at least one of a vertical cavity surface emitting laser (VCSEL), an IR sensor, and/or a photodiode. For example, the photodiode may include a positive intrinsic negative (PIN) photodiode or an avalanche photodiode (APD). A photodiode may also be referred to as a photo detector or a photo sensor.

According to an embodiment, at least one of the first camera module 251, the second camera module 253, or the third camera module 255 may include a plurality of camera modules (not shown). For example, the second camera module 253 may include a plurality of lenses (e.g., wide-angle and telephoto lenses) and image sensors, and may be disposed on one surface (e.g., a surface facing the −Y axis) of the electronic device 101. For example, the electronic device 101 may include a plurality of camera modules having different attributes (e.g., angles of view (AOVs)) or functions from each other, and control to change the AOVs of the camera modules based on a user selection and/or trajectory information. For example, at least one of the plurality of camera modules may be a wide-angle camera, and at least another may be a telephoto camera.

According to various embodiments, the processor (e.g., the processor 120 of FIG. 1) may determine a movement of the electronic device and/or a user movement, using information about the electronic device 101 obtained by at least one of a gesture sensor, a gyro sensor, or an acceleration sensor of the sensor module (e.g., the sensor module 176 of FIG. 1) and a user action (e.g., approach of the user body to the electronic device 101) detected by the third camera module 255. According to an embodiment, the electronic device 101 may include a magnetic (geomagnetic) sensor capable of measuring a bearing using a magnetic field and a magnetic force line, and/or a hall sensor capable of obtaining movement information (e.g., a movement direction or a movement distance) using the strength of a magnetic field. For example, the processor may determine a movement of the electronic device 101 and/or a user movement based on information obtained from the magnetic (geomagnetic) sensor and/or the hall sensor.

According to various embodiments, although not shown, the electronic device 101 may perform an input function (e.g., a touch and/or pressure sensing function) for enabling interaction with the user. For example, a component configured to perform the touch and/or pressure sensing function (e.g., a touch sensor and/or a pressure sensor) may be disposed in at least a part of the wearing member 203. The electronic device 101 may control a virtual image output through the display member 201 based on information obtained through the component. For example, the sensor related to the touch and/or pressure sensing function may be configured as various types such as a resistive type, a capacitive type, an electro-magnetic (EM) type, or an optical type. According to an embodiment, the component configured to perform the touch and/or pressure sensing function may be wholly or partially identical to that of the input module 150 of FIG. 1.

According to embodiments, the electronic device 101 may include a reinforcing member 260 disposed in an inner space of the lens frame 202 and formed to have a higher rigidity than that of the lens frame 202.

According to embodiments, the electronic device 101 may include a lens structure 270. The lens structure 270 may refract at least a part of light passing therethrough. For example, the lens structure 270 may be a prescription lens with a specified refractive power. According to an embodiment, the lens structure 270 may be disposed behind (e.g., the +Y direction) of a second window member (not shown) of the display member 201. For example, the lens structure 270 may be located between the display member 201 and the user's eye. For example, the lens structure 270 may face one surface of the display member.

According to embodiments, the housing 210 may include a hinge cover 227 that may conceal a part of the hinge structure 229. Another part of the hinge structure 229 may be accommodated or concealed between the inner case 231 and an outer case 233 to be described later.

According to various embodiments, the wearing member 203 may include the inner case 231 and the outer case 233. The inner case 231, which is, for example, a case configured to face the user's body or directly contact the user's body, may be made of a material having low thermal conductivity, for example, a synthetic resin. According to an embodiment, the inner case 231 may include an inner surface (e.g., the inner surface 231c of FIG. 2) facing the user's body. The outer case 233 may include, for example, a material (e.g., a metal material) which may at least partially transfer heat, and may be coupled with the inner case 231 to face the inner case 231. According to an embodiment, the outer case 233 may include an outer surface (e.g., the outer surface 231d of FIG. 2) opposite to the inner surface 231c. In an embodiment, at least one of the circuit board 241 or the speaker module 245 may be accommodated in a space separated from the battery 243 inside the wearing member 203. In the illustrated embodiment, the inner case 231 may include a first case 231*a* including the circuit board 241 and/or the speaker module 245, and a second case 231*b* accommodating the battery 243. The outer case 233 may include a third case 233*a* coupled with the first case 231*a* to face the first case 231*a*, and a fourth case 233*b* coupled with the second case 231*b* to face the second case 231*b*. For example, the first case 231*a* and the third case 233*a* may be coupled with each other (hereinafter, referred to as a "first case part 231*a* and 233*a*") to accommodate the circuit board 241 and/or the speaker module 245. The second case 231*b* and the fourth case 233*b* may be coupled with each other (hereinafter, referred to as a 'second case part 231*b* and 233*b*') to accommodate the battery 243.

According to an embodiment, the first case part 231*a* and 233*a* may be rotatably coupled with the lens frame 202 through the hinge structure 229, and the second case part 231*b* and 233*b* may be connected to or mounted on an end of the first case part 231*a* and 233*a* through a connecting structure 235. In a certain embodiment, a part of the connecting structure 235 that comes into contact with the user's body may be made of a material having a low thermal conductivity, for example, silicon, polyurethane, or an elastic material such as rubber, whereas a part of the connecting structure 235 that does not come into contact with the user's body may be made of a material with a high thermal conductivity (e.g., a metal material). For example, when heat is generated from the circuit board 241 or the battery 243, the connecting structure 235 may block the heat from being transferred to the part in contact with the user's body, and disperse or release the heat through the part not in contact with the user's body. According to an embodiment, the part of the connecting structure 235 configured to come into contact with the user's body may be interpreted or defined as a part of the inner case 231, and the part of the connecting structure 235 that does not contact the user's body may be interpreted or defined as a part of the outer case 233. According to an embodiment (not shown), the first case 231*a* and the second case 231*b* may be integrally configured without the connecting structure 235, and the third case 233*a* and the fourth case 233*b* may be integrally configured without the connecting structure 235. According to various embodiments, other components (e.g., the antenna module 197 of FIG. 1) may be further included in addition to the illustrated components, and information about an object or an environment may be provided from an external electronic device (e.g., the electronic device 102 or 104, or the server 108 of FIG. 1) through a network (e.g., the first network 198 or the second network 199 of FIG. 1), using the communication module 190.

While embodiments where the electronic device 101 is a wearable electronic device in the form of eyeglasses are described above with reference to FIGS. 2 to 4, by way of example, but not being limited thereto. For example, the electronic device 101 may refer to a device that performs a specific function according to a loaded program, such as an electronic notebook, a portable multimedia player, a mobile communication terminal, a tablet personal computer (PC), a video/audio device, a desktop/laptop computer, and a vehicle navigation system, and the disclosure is applicable to all electronic devices equipped with a circuit board among these electronic devices.

Figure 5:
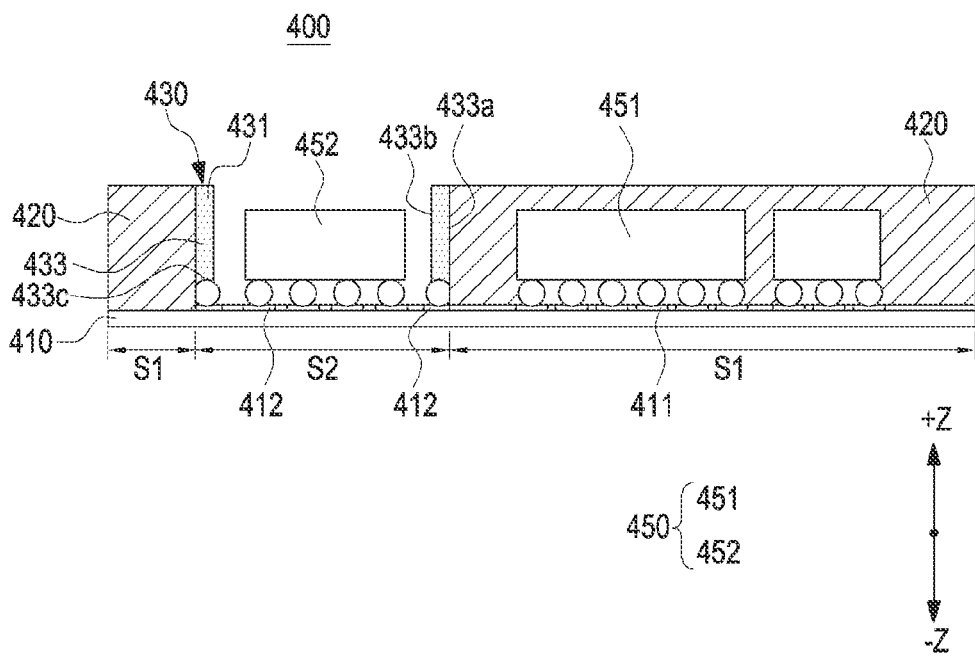
FIG. 5 is a cross-sectional view illustrating a circuit board module according to an embodiment of the disclosure.

FIG. 5 is a cross-sectional view illustrating a circuit board module according to an embodiment of the disclosure.

Figure 6:
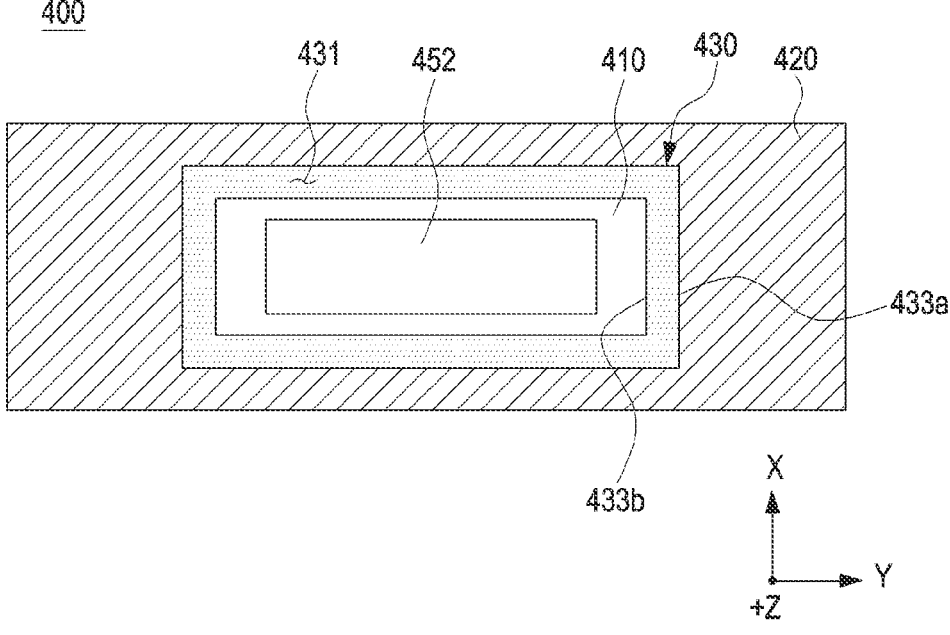
FIG. 6 is a top plan view illustrating an area of a circuit board module according to an embodiment of the disclosure.

FIG. 6 is a top plan view illustrating an area of a circuit board module according to an embodiment of the disclosure.

Figure 7:
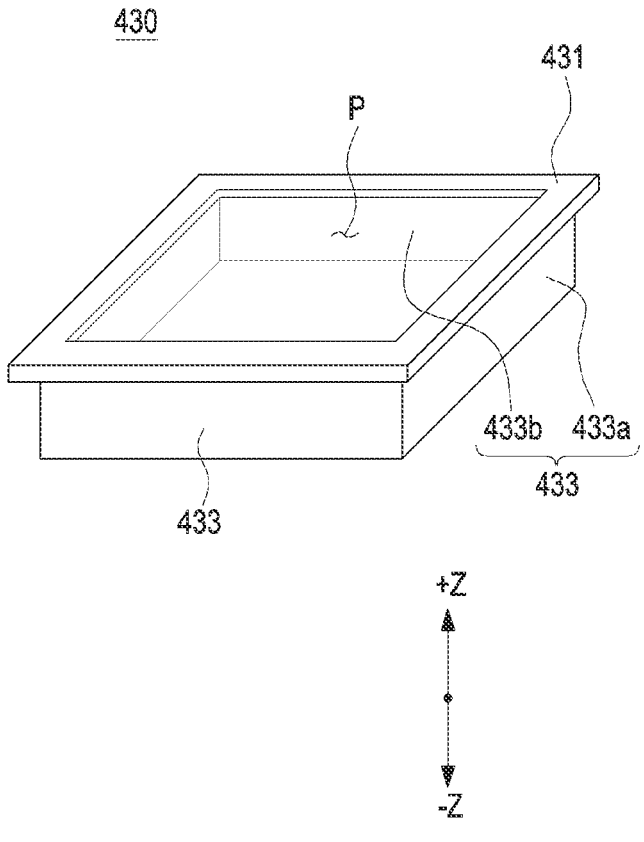
FIG. 7 is a perspective view illustrating an open structure in a circuit board module according to an embodiment of the disclosure.

FIG. 7 is a perspective view illustrating an open structure in a circuit board module according to an embodiment of the disclosure.

According to an embodiment, the electronic device 101 may include a housing (e.g., the housing 210 of FIG. 2) and a circuit board module 400 disposed inside the housing. The circuit board module 400 may include a circuit board 410, a plurality of components 450 (e.g., a first component 451 and a second component 452), a shielding mold 420, and an open structure 430. Here, the open structure 430 may be a structure that defines an opening (P in FIG. 7) through the shielding mold 420. The circuit board 410 of FIGS. 5, 6, and 7 may be partially or wholly identical to the circuit board 241 of FIGS. 2 and 3. The structures of FIGS. 5, 6, and 7 may be selectively combined with the structures of FIGS. 2, 3, and 4.

In FIGS. 5, 6, and 7, a 'Z-axis direction' may mean a thickness direction of the circuit board module 400. In addition, in an embodiment of the disclosure, a '+Z direction' may mean a direction (e.g., a first direction) in which the circuit board module 400 faces the user, and a '−Z-axis direction' may mean a direction (e.g., a second direction) in which the circuit board module 400 faces the opposite to the user, based on the user wearing the electronic device. However, the directions are merely exemplary, and an opposite direction of the user may be the +Z-axis direction, and a direction toward the user may be the −Z-axis direction.

According to an embodiment, the circuit board module 400 may include a plurality of stacked substrates. At least one conductive layer and at least one dielectric layer may be alternately stacked on each substrate. According to an embodiment, a plurality of electrical components may be disposed on one circuit board 410 with a plurality of stacked substrates in the circuit board module 400.

According to an embodiment, at least one of the plurality of components 450 may be a first component 451 desired to be shielded from the outside. For example, the first component 451 may be a heat source that generates electromagnetic waves or heat, for example, at least one of a power management integrated circuit (PMIC), a power amplifier (PAM), an application processor (AP), or a communication processor (CP), a charger integrated circuit (IC), a display driver integrated circuit (DDI), or a communication circuit (e.g., a transceiver, an active communication element, or a passive communication element).

According to an embodiment, at least another one of the plurality of components 450 may be the second component 452 desired to be exposed to the outside. When it is described that an electrical component is exposed to the outside, this may mean that the electrical component is not shielded or concealed by a shielding structure, and when viewed from above the circuit board, at least a part of the component is exposed and connected to external components, or is disposed at a position that enables radiation of light or electromagnetic waves to the outside. For example, the second component 452 may be at least one of a 6-axis sensor (e.g., a gyro, acceleration, and temperature sensor), a global positioning system (GPS), a con to con connector, a clip-type connector, a radio frequency (RF) switch, an RF tuning passive element (LC), a recognition mark, a testpoint, a microphone, an embedded subscriber identification module (eSIM), or a steel use stainless (SUS) mechanism.

According to an embodiment, the circuit board 410 may include a first area S1 and a second area S2 extending from the first area S1. The first area S1 may be defined or formed to surround the second area S2. The first component 451 may be disposed in the first area S1 of the circuit board 410, and the second component 452 may be disposed in the second area S2 of the circuit board 410.

According to an embodiment, a plurality of first pads 411 may be disposed in the first area S1 of the circuit board 410 to dispose (e.g., mount) the first component 451 thereon. The first component 451 and the plurality of first pads 411 in the first area S1 may be electrically connected to each other through soldering using solder paste. The plurality of first pads 411 may include or be formed of copper foil. According to an embodiment, a plurality of second pads 412 may be disposed in the second area S2 of the circuit board 410 to dispose the second component 452 thereon. The second component 452 and the plurality of second pads 412 of the second area S2 may be electrically connected to each other through a soldering process using solder paste. The plurality of second pads 412 may include or be formed of copper foil. The plurality of first pads 411 and the plurality of second pads 412 may be provided in a same shape as each other or different shapes from each other using a same material as each other or different materials from each other depending on the types of the components.

According to an embodiment, the shielding mold 420 may be formed to surround at least a part of the first component 451. The shielding mold 420 is a structure disposed in the entire first area S1 of the circuit board 410, and may be formed through a full molding process. According to the full molding process, for example, with the first component 451 disposed in the first area S1 of the circuit board 410, a mold frame formed to surround the entire area of the circuit board 410 may be disposed. After the mold frame is disposed, the shielding mold 420 that may cover the first area S1 and the electrical components (e.g., the first component 451) disposed in the first area S1 may be formed by injecting a mold into the mold frame. The shielding mold 420 may be formed to entirely surround the top and side surfaces of the first component 451. The shielding mold 420 may cover the top and side surfaces of the first component 451 in contact with the top and side surfaces of the first component 451.

According to an embodiment, as the second component 452 disposed in the second area S2 of the circuit board 410 is surrounded by the open structure 430, the second component 452 may not be shielded by the shielding mold 420. The open structure 430 is a structure with its top and bottom opened, and may be disposed in the second area S2 of the circuit board 410. The open structure 430 may include a top portion 431 which is at least partially opened as indicated by P, and sidewalls 433 extending in a direction (e.g., the ±Z-axis direction) perpendicular to the top portion 431. The sidewalls 433 may have a height (e.g., a height in the ±Z-axis direction) greater than that of the second component 452, and be disposed to cover all side surfaces of the second component 452. For example, where the second component 452 has a hexahedral shape, the sidewalls 433 of the open structure 430 may include four walls.

According to an embodiment, the sidewalls 433 of the open structure 430 may be disposed along the edge of the second area S2 of the circuit board 410. Each of the sidewalls 433 may include an outer surface 433a, an inner surface 433b, and a bottom surface 433c, and the bottom surface 433c may be electrically connected to one of the plurality of second pads 412 in the second area S2 through a soldering process using solder paste.

According to an embodiment, the open structure 430 may be manufactured as an integral structure through a mold. The open structure 430 may include or be made of stainless steel or aluminum.

According to an embodiment, the outer surface 433a of each of the sidewalls 433 of the open structure 430 may contact the shielding mold 420, and the inner surface 433b thereof may be disposed to be spaced apart from the second component 452. For example, since the inner space of the open structure 430 is a space for isolating the second area S2 from the first area S1 so that the shielding mold 420 may not be introduced, the shielding mold 420 may extend to and contact the outer surface 433a of each of the sidewalls 433 of the open structure 430, and may be separated from the inner surface 433b. For example, a separation distance between the inner surface 433b of each of the sidewalls 433 and the second component 452 may be approximately 0.15 millimeter (mm) or less. A space between the inner surface 433b of each of the sidewalls 433 and the second component 452 may be filled with air. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

According to an embodiment, the sidewalls 433 of the open structure 430 may be formed to have a specified thickness. For example, the sidewalls 433 of the open structure 430 may be designed to correspond to the size of the second pads 412. The length (or area) of one side of the bottom surface 433c of each of the sidewalls 433 of the open structure 430 may be substantially the same as the length (or area) of one side of each of the second pads 412, and the length may be approximately 0.4 mm or less.

According to an embodiment, as the second component 452 is exposed, the open structure 430 may be formed to be electrically connected to an external component. Therefore, when the open structure 430 is viewed from above or in a top plan view, at least a part (e.g., the second area S2) of the second component 452 and/or the circuit board 410 may be formed to be exposed (e.g., visible) through the opening P of the top portion 431. In the open structure 430, the sidewalls 433 may be continuously connected to provide a closed loop shape and restrict the introduction of the shielding mold 420 into the second area S2.

According to an embodiment, before the full molding process is performed, the second component 452 and the open structure 430 may be disposed in the second area S2 of the circuit board 410, and a mold frame may be disposed. When a mold is injected into the mold frame, the top portion 431 of the open structure 430 may be disposed in contact with the mold and sealed, and the bottom surface 433c of each of the sidewalls 433 of the open structure 430 may be coupled with the circuit board 410 and sealed through soldering, to prevent the introduction of the mold toward the second area S2 and the second component 452 disposed in the second area S2. According to an embodiment, as the top portion 431 of the open structure 430 extends in an outward direction (e.g., in a direction toward the second area S2), the top portion 431 may be formed to have a larger area or width than the sidewalls 433 viewed from above. Accordingly, the top portion 431 of the open structure 430 may increase a sealing strength according to the increased contact area with the mold frame, and effectively prevent the mold from entering the second area S2 of the circuit board 410.

Figure 8:
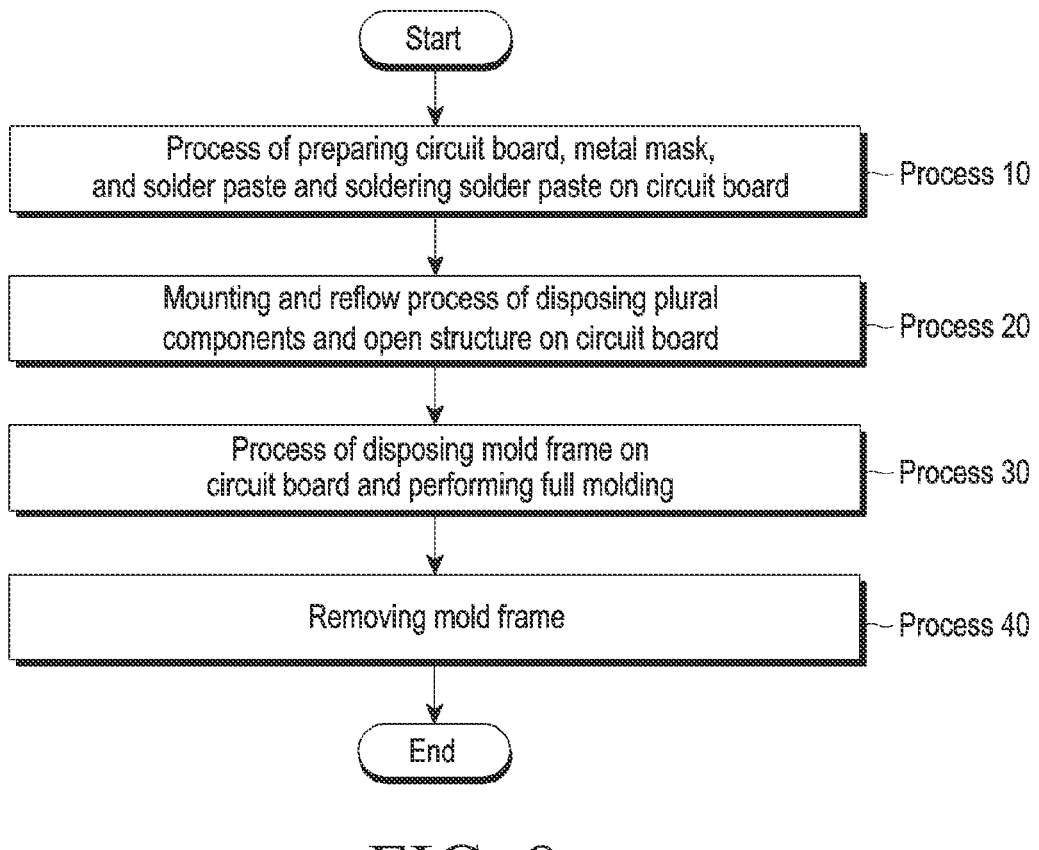
FIG. 8 is a flowchart illustrating a process for a circuit board module including an open structure according to an embodiment of the disclosure.

FIG. 8 is a flowchart illustrating a process for a circuit board module including an open structure according to an embodiment of the disclosure.

Figure 9:
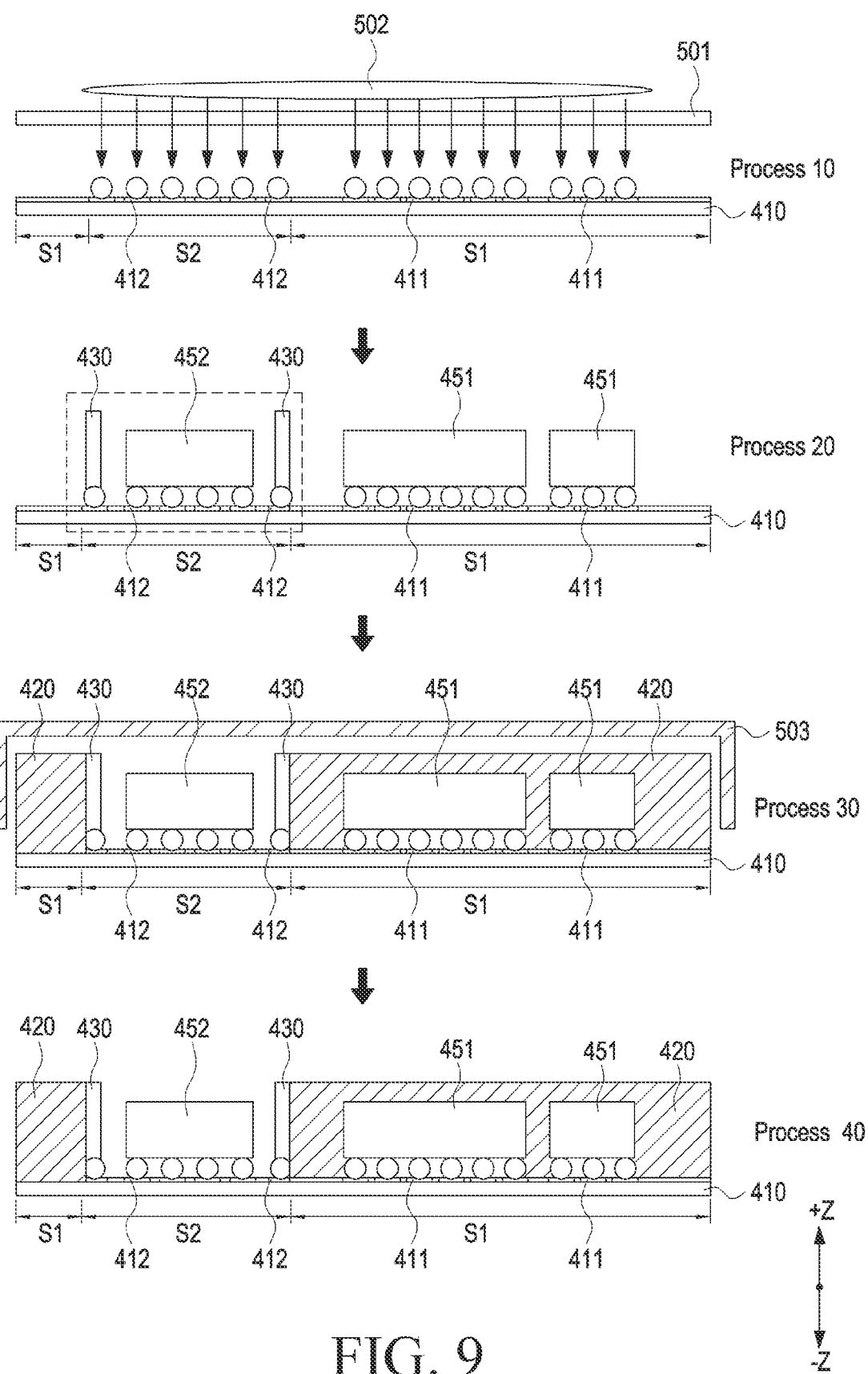
FIG. 9 is a diagram illustrating a process for a circuit board module including an open structure according to an embodiment of the disclosure.

FIG. 9 is a diagram illustrating a process for a circuit board module including an open structure according to an embodiment of the disclosure.

According to an embodiment, the electronic device 101 may include the housing (e.g., the housing 210 of FIG. 2) and the circuit board module 400 disposed in the housing. The circuit board module 400 may include the circuit board 410, the plurality of components 450 (e.g., the first component 451 and the second component 452), the shielding mold 420, and the open structure 430.

The circuit board 410, the plurality of components 450 (e.g., the first component 451 and the second component 452), the shielding mold 420, and the open structure 430 of FIGS. 8 and 9 may be partially or wholly identical to the circuit board 410, the plurality of components 450 (e.g., the first component 451 and the second component 452), the shielding mold 420, and the open structure 430 of FIGS. 5, 6, and 7. The structure of FIGS. 8 and 9 may be selectively combined with the structures of FIGS. 5, 6 and 7.

A description will be given below of the plurality of components 450 (e.g., the first component 451 and the second component 452) disposed on the circuit board 410, the shielding mold 420, and the open structure 430.

According to process 10, the circuit board 410 with a plurality of pads (e.g., the first pads 411 and the second pads 412) disposed thereon, a metal mask 501, and a solder paste dummy 502 may be prepared, and soldering may be performed to dispose the plurality of components 450 on the circuit board 410. The circuit board 410 may include the first area S1 and the second area S2 extending from the first area S1, the plurality of first pads 411 may be disposed in the first area S1, and the plurality of second pads 412 may be disposed in the second area S2. The plurality of first pads 411 and the plurality of second pads 412 may include or be formed of copper foil.

The metal mask 501 having a size corresponding to that of the circuit board 410 may be disposed on the circuit board 410 with the plurality of pads (e.g., the first pads 411 and the second pads 412) disposed thereon. The solder paste dummy 502 may pass through an opening defined or formed through the metal mask 501, and a certain amount of solder paste may be disposed at specified positions of the circuit board 410. For example, some of the solder paste may be disposed on the plurality of first pads 411 of the first area S1 of the circuit board 410, and other solder paste may be disposed on the plurality of second pads 412 in the second area S2 of the circuit board 410.

According to process 20, a mounting and reflow process may be performed to dispose the plurality of components 450 (e.g., the first component 451 and the second component 452) and the open structure 430 on the circuit board 410. The solder paste disposed on each of the plurality of first pads 411 in the first area S1 of the circuit board 410 may be connected to the first component 451. The solder paste disposed on each of the plurality of second pads 412 in the second area S2 of the circuit board 410 may be connected to the second component 452 and/or the open structure 430. The mounting and reflow process may be performed at a temperature in a range of approximately 230 to 250 degrees Celsius.

According to an embodiment, the open structure 430 is a structure with its top and bottom opened, and may be disposed in the second area S2 of the circuit board 410. The open structure 430 may include the sidewalls 433 disposed to surround the second component 452 and extending in a direction (e.g., the ±Z-axis direction) perpendicular to one surface of the circuit board 410. The open structure 430 may be manufactured as an integral structure through a mold. The open structure 430 may include or be made of stainless steel or aluminum.

According to process 30, a mold frame 503 may be disposed on the circuit board 410 with the plurality of components 450 (e.g., the first component 451 and the second component 452) and the open structure 430 disposed thereon, and a full molding process of injecting the mold into the mold frame 503 may be performed. The mold frame 503 may be disposed to cover the entire area of the circuit board 410, the plurality of components 450 (e.g., the first component 451 and the second component 452) disposed on the circuit board 410, and the open structure 430.

The first area S1 of the circuit board 410 and the first component 451 disposed in the first area S1 may be entirely covered by the shielding mold 420 due to the full molding process. For example, the shielding mold 420 may completely contact and cover the top surface of the first area S1 of the circuit board 410. For example, the shielding mold 420 may cover the top and side surfaces of the first component 451 in full contact with the top and side surfaces of the first component 451.

When the full molding process is performed, the second component 452 disposed in the second area S2 of the circuit board 410 may be covered with the open structure 430, and thus may not be covered or shielded by the shielding mold 420. The bottom of the open structure 430 disposed along the edge of the second area S2 of the circuit board 410 may be brought into contact with the second pads 412 including or made of continuous copper foil, thereby limiting the introduction of the mold. The top of the open structure 430 may be sealed in contact with the bottom surface of the mold frame 503, so that the mold may not be introduced into the second area S2 of the circuit board 410.

According to process 40, when the full molding process is completed, and the mold framed is removed, the second component 452 may be located inside the open structure 430 to be exposed, and a part except for the second area S2 of the circuit board 410 may be covered by the shielding mold 420. According to an embodiment, the open structure 430 may be connected to a ground through the second pads 412 in the second area S2 of the circuit board 410, thereby serving as a shield.

Figure 10:
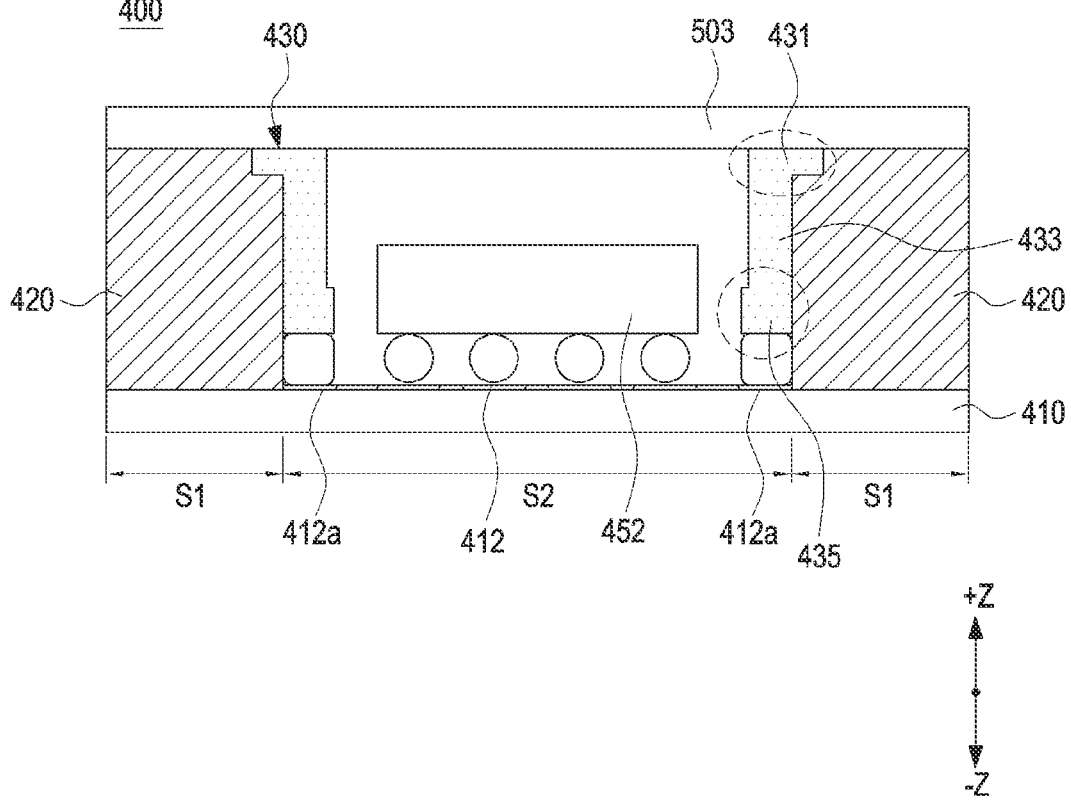
FIG. 10 is a cross-sectional view illustrating a circuit board module including an open structure according to an embodiment of the disclosure.

FIG. 10 is a cross-sectional view illustrating a circuit board module including an open structure according to an embodiment of the disclosure.

According to an embodiment, the electronic device 101 may include the housing (e.g., the housing 210 of FIG. 2) and the circuit board module 400 disposed in the housing. The circuit board module 400 may include the circuit board 410, the second component 452, the shielding mold 420, and the open structure 430.

The circuit board 410, the second component 452, the shielding mold 420, and the open structure 430 of FIG. 10 may be partially or wholly identical to the circuit board 410, the second component 452, the shielding mold 420, and the open structure 430 of FIGS. 5, 6, 7, 8, and/or 9. The structure of FIG. 10 may be selectively combined with the structure of FIGS. 5, 6, 7, 8, and/or 9.

FIG. 10 is a diagram illustrating a state in which the open structure 430 and the mold frame 503 are disposed in contact with each other, which may be the state of process 30 in FIGS. 8 and 9. The completed circuit board module 400 may be in a state in which the mold frame 503 has been removed.

According to an embodiment, the circuit board 410 may include the first area S1 and the second area S2 extending from the first area S1. The first area S1 may be formed to surround the second area S2. The first component (not shown) may be disposed in the first area S1 of the circuit board 410, and the second component 452 may be disposed in the second area S2 of the first circuit board 410.

According to an embodiment, as the second component 452 disposed in the second area S2 of the circuit board 410 is covered with the open structure 430, the second component 452 may not be shielded by the shielding mold 420. The second component 452 and the open structure 430 may be disposed to be connected to the plurality of second pads 412 disposed in the second area S2 of the circuit board 410.

According to an embodiment, the open structure 430 is a structure with its top and bottom opened, and may be disposed in the second area S2 of the circuit board 410. The open structure 430 may include or be formed of stainless steel or aluminum as an integral structure.

According to an embodiment, the open structure 430 may include the top portion 431 at least partially opened, the bottom portion 435, and the sidewalls 433 extending in the direction (e.g., the ±Z-axis direction) perpendicular to the top portion 431 (or the bottom portion 435). The open structure 430 may have a stepped or curved shape in its cross-section. For example, the top portion 431 and a sidewall 433 may be in a '¬' shape, and the sidewall 433 and the bottom portion 435 may be in a 'L' shape. As the top portion 431 of the open structure 430 protrudes more outward (e.g., in the direction toward the shielding mold 420) than the sidewalls 433, an area contacting the mold frame 503 may be increased. As the top portion 431 of the open structure 430 is formed to directly contact the mold frame 503, a height error between the open structure 430 and the mold frame 503 may be counterbalanced, and a sealing strength may be increased. As the bottom portion 435 of the open structure 430 protrudes more inward than the sidewalls 433 (e.g., in a direction opposite to the shielding mold 420), an area contacting and connected to one pad 412a having a closed-loop shape among the second pads 412 of the circuit board 410 may be increased, and the sealing strength may be increased. Accordingly, the shapes of the protruding top portion 431 and bottom portion 435 of the open structure 430 may improve the blocking performance of preventing the introduction of the mold into the second area S2 during the mold injection process.

According to an embodiment, the sidewalls 433 of the open structure 430 may be designed to have a thickness in a range of approximately 0.1 mm to 0.15 mm or less, and the top portion 431 and the bottom portion 435 of the open structure 430 may be designed to have a thickness of approximately 0.4 mm or less. Among the second pads 412 of the circuit board 410, the one pad 412a having the closed-loop shape corresponding to the bottom portion 435 of the open structure 430 may be designed to have a width of 0.4 mm or less. Compared to a typical internal shielding structure (e.g., a shield can) of a portable electronic device, as the top portion 431, the bottom portion 435, and the sidewalls 433 of the open structure 430 form a thinner structure, an arrangement space inside the electronic device may be reduced.

Figure 11:
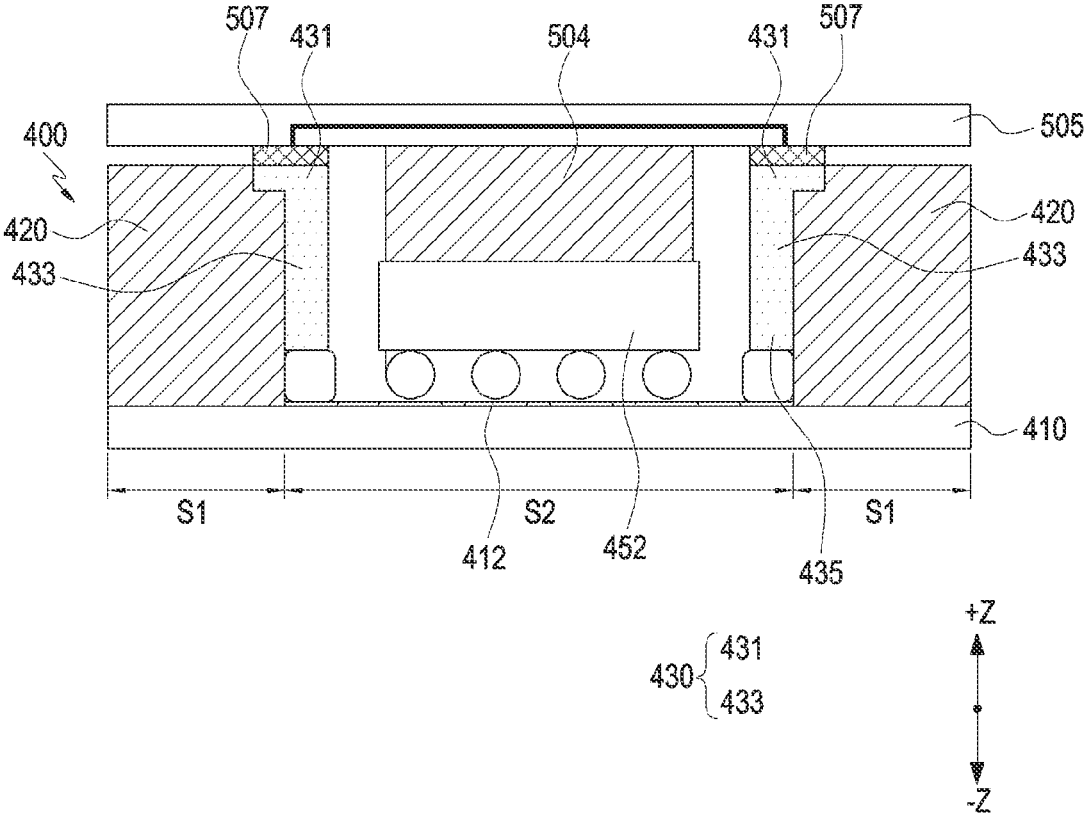
FIG. 11 is a cross-sectional view illustrating a circuit board module including an open structure according to an embodiment of the disclosure.

FIG. 11 is a cross-sectional view illustrating a circuit board module including an open structure according to an embodiment of the disclosure.

According to an embodiment, the electronic device 101 may include the housing (e.g., the housing 210 of FIG. 2) and the circuit board module 400 disposed in the housing. The circuit board module 400 may include the circuit board 410, the second component 452, the shielding mold 420, and the open structure 430.

The circuit board 410, the second component 452, the shielding mold 420, and the open structure 430 of FIG. 11 may be partially or wholly identical to the circuit board 410, the second component 452, the shielding mold 420, and the open structure 430 of FIGS. 5, 6, 7, 8, 9 and/or 10. The structure of FIG. 11 may be selectively combined with the structure of FIGS. 5, 6, 7, 8, 9 and/or 10.

According to an embodiment, the circuit board 410 may include the first area S1 and the second area S2 extending from the first area S1. The first area S1 may be formed to surround the second area S2. The first component (not shown) may be disposed in the first area S1 of the circuit board 410, and the second component 452 may be disposed in the second area S2 of the first circuit board 410.

According to an embodiment, as the second component 452 disposed in the second area S2 of the circuit board 410 is covered with the open structure 430, it may not be shielded by the shielding mold 420. The second component 452 and the open structure 430 may be disposed to be connected to the plurality of second pads 412 disposed in the second area S2 of the circuit board 410.

According to an embodiment, the second component 452 is an exposed component and may be electrically connected to other components in the electronic device. For example, where the second component 452 is provided as a connector, the second component 452 may be electrically connected to a connector of another component.

According to an embodiment, the open structure 430 is a structure with its top and bottom opened, and may be disposed in the second area S2 of the circuit board 410. The open structure 430 may include the top portion 431 which is at least partially opened, and the sidewalls 433 extending in a direction (e.g., the ±Z-axis direction) perpendicular to the top portion 431.

According to an embodiment, a mechanism 504 (e.g., a rear cover) may be disposed on the circuit board module 400. In an embodiment where the mechanism 504 is disposed in the second area S2 of the circuit board 410, the mechanism 504 may facilitate shielding of the second component 452, together with the open structure 430. For example, a side surface of the second component 452 may be shielded by the open structure 430, and a top surface of the second component 452 may be shielded by the mechanism 504.

According to an embodiment, the mechanism 504 disposed in the second area S2 may include a ground pad 507 connected to the top portion 431 of the open structure 430. The ground pad 507 may have a shape (e.g., a closed-loop shape) corresponding to the top portion 431 of the open structure 430, and may be a part of a laser direct structuring (LDS) pattern located inside or outside the mechanism 504. As the ground pad 507 of the mechanism 504 is connected to the top portion 431 of the open structure 430, shielding performance may be improved.

Figure 12:
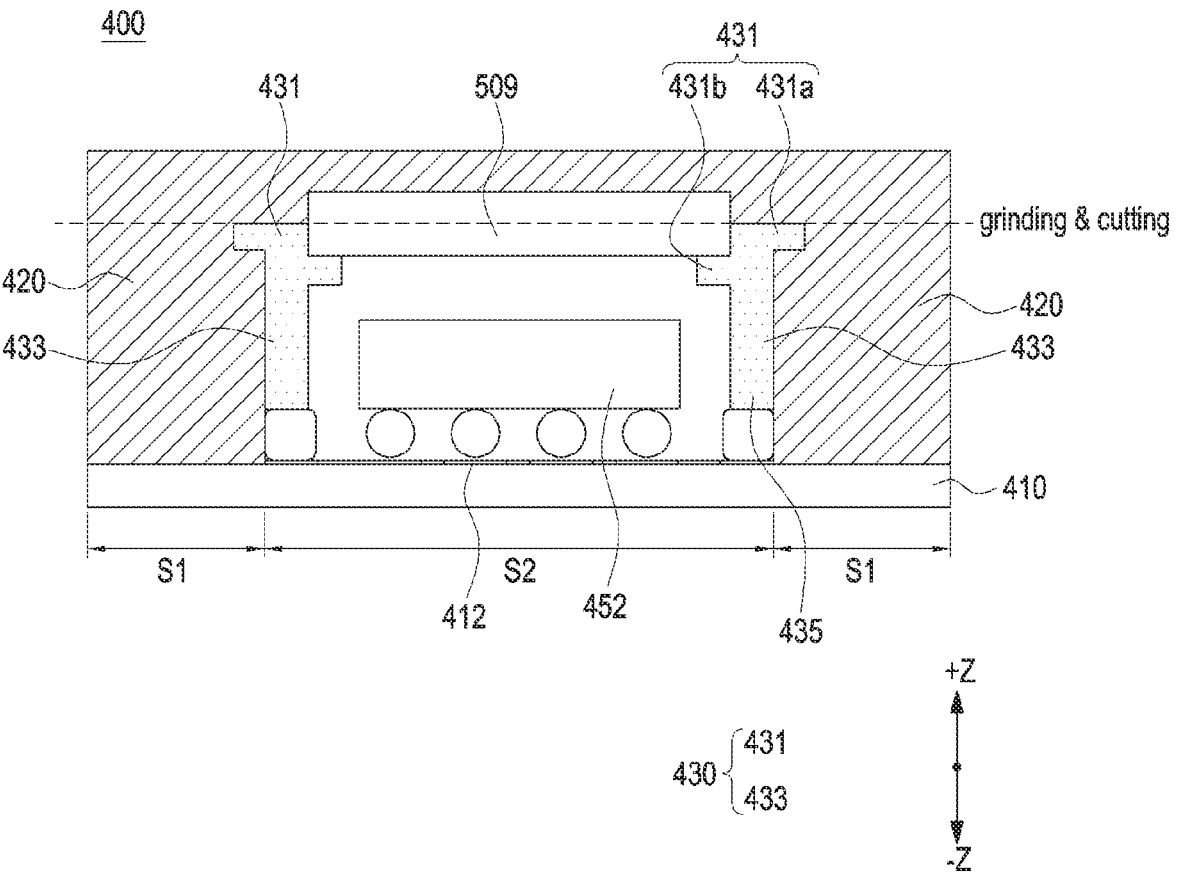
FIG. 12 is a cross-sectional view illustrating a circuit board module including an open structure according to an embodiment of the disclosure.

FIG. 12 is a cross-sectional view illustrating a circuit board module including an open structure according to an embodiment of the disclosure.

According to an embodiment, the electronic device 101 may include the housing (e.g., the housing 210 of FIG. 2) and the circuit board module 400 disposed in the housing. The circuit board module 400 may include the circuit board 410, the second component 452, the shielding mold 420, and the open structure 430.

The circuit board 410, the second component 452, the shielding mold 420, and the open structure 430 of FIG. 12 may be partially or wholly identical to the circuit board 410, the second component 452, the shielding mold 420, and the open structure 430 of FIGS. 5, 6, 7, 8, and/or 9. The structure of FIG. 12 may be selectively combined with the structure of FIGS. 5, 6, 7, 8, and/or 9.

According to an embodiment, the circuit board 410 may include the first area S1 and the second area S2 extending from the first area S1. The first area S1 may be formed to surround the second area S2. The first component (not shown) may be disposed in the first area S1 of the circuit board 410, and the second component 452 may be disposed in the second area S2 of the first circuit board 410.

According to an embodiment, as the second component 452 disposed in the second area S2 of the circuit board 410 is covered with the open structure 430, the second component 452 may not be shielded by the shielding mold 420. The second component 452 and the open structure 430 may be disposed to be connected to the plurality of second pads 412 disposed in the second area S2 of the circuit board 410.

According to an embodiment, the open structure 430 is a structure with its top and bottom opened, and may be disposed in the second area S2 of the circuit board 410. The open structure 430 may include the top portion 431 which is at least partially opened, and the sidewalls 433 extending in the direction (e.g., the ±Z-axis direction) perpendicular to the top portion 431.

FIG. 12 shows an embodiment where grinding and laser cutting are performed after a full mold process (e.g., process 30 of FIG. 8) for miniaturization of the circuit board module 400. For example, when the height of the shielding mold 420 inevitably rises due to a height difference between components disposed in the first area S1 of the circuit board 410 in the full molding process, a thermally conductive member 509 may be disposed on the open structure 430, and then a part of the thermally conductive member 509 together with a top portion of the shielding mold 420 may be ground and/or laser-cut.

According to an embodiment, the top portion 431 of the open structure 430 may include a second part 431*b* for disposing the thermally conductive member 509 thereon in addition to a first portion 431*a* protruding toward the shielding mold 420. The second portion 431*b* may protrude in the opposite direction to the first portion 431*a*, and form a step with the sidewalls 433 to prevent the thermally conductive member 509 from falling downward (e.g., in the −Z-axis direction). The thermally conductive member 509 may be of a highly heat-resistant composite material, for example, polyimide that may withstand a process temperature (approximately 230 to 250 degrees Celsius) of reflow (e.g., process 20 of FIG. 8).

A printed board assembly (PBA) disposed inside a small electronic device may utilize a shield can or a mold (and conformal shield) process in an area desired to be shielded. The outer volume of the shield can occupies a lot of space, and thus a structure formed through molding may be desirable.

In the case of a component (e.g., a sensor or a connector) desired to be exposed among components disposed on the PBA, the component may be disposed on a surface opposite to a surface to which the molding process is applied, which may make it difficult to make a miniaturized and lightweight electronic device. When the component desired to be exposed is disposed on the surface to which the molding process is applied, a partial molding process may be used. However, because a structure resulting from the partial molding reduces a side grounding area of the PBA, electromagnetic interference (EMI) shielding performance may decrease. Moreover, a partial mold structure may be weak relative to a general mold (e.g., full mold) structure, and a height error in a material itself and a height difference depending on the presence or absence of a copper foil pattern and a solder resist may cause mold leakage failure. In addition, because a mold frame for the partial molding process should be changed for each product, it may take much time to fabricate mold frames.

The technical objects to be achieved in the disclosure are not limited to the above-mentioned technical object, and other unmentioned technical objects may be clearly understood by those skilled in the art.

According to an embodiment of the disclosure, as an area for shielding and an area for arranging components to be exposed are provided on one surface of a PBA in an electronic device, arrangement space efficiency may be improved.

According to an embodiment of the disclosure, as an open structure surrounding a component to be exposed is disposed on a circuit board, the component to be exposed may be provided on a same surface as a shielded component along with a full molding process. Accordingly, compared to a structure formed by a partial molding process, EMI shielding performance and a strength may be increased, mold leakage failure may be effectively prevented, and a time taken to fabricate a mold frame may be reduced.

Effects that may be achieved in the disclosure are not limited to the above-mentioned effect, and other technical effects not mentioned may be clearly understood by those skilled in the art.

The electronic device 101 according to an embodiment of the disclosure may include the housing 210, the circuit board 410 disposed in the housing, the first component 451 and the second component 452 disposed on one surface of the circuit board, the shielding mold 420 disposed on the one surface of the circuit board to cover top and side surfaces of the first component, and the open structure 430 disposed on the one surface of the circuit board to surround a side surface of the second component. In the open structure, the top portion 431 may be opened and expose a part of the second component or the circuit board, the inner surface 433*b* may be spaced apart from the second component, and the outer surface 433*a* may contact the shielding mold.

According to an embodiment, the circuit board may include the first area S1 and the second area S2 surrounded by the first area. The first component 451 may be disposed on the first area, and the second component 452 spaced apart from the first component may be disposed on the second area.

According to an embodiment, the plurality of first pads 411 may be disposed on the first area S1 of the circuit board 410, and the first component and the plurality of first pads may be connected to each other by soldering. The plurality of second pads 412 may be disposed in the second area S2 of the circuit board 410, and the second component and the open structure may be connected to the plurality of second pads by soldering.

According to an embodiment, one pad 412*a* of the plurality of second pads 412 may be connected to the open structure and have a closed-loop shape.

According to an embodiment, the open structure may include the plurality of sidewalls 433 extending vertically from the top portion 431 and disposed to surround the second component 452. The plurality of sidewalls may have a closed-loop shape disposed along an edge of the second area S2 of the circuit board.

According to an embodiment, the bottom surface of each of the plurality of sidewalls 433 may be disposed in contact with the circuit board.

According to an embodiment, the second component may be at least one of a sensor, a GPS, a con to con connector, a clip-type connector, an RF switch, a passive element (LC) for RF tuning, a recognition mark, a testpoint, a microphone, an eSIM, or an SUS mechanism.

According to an embodiment, a separation space between the inner surface of the open structure and the second component may be filled with air.

According to an embodiment, the open structure may include a metal material.

According to an embodiment, the top portion of the open structure may extend outward toward the first component. The first part of the top portion may be connected to the plurality of sidewalls, and the second part extending from the first part is disposed in contact with the shielding mold.

According to an embodiment, the top portion of the open structure and the plurality of sidewalls extending from the top portion may have a stepped shape.

According to an embodiment, the top portion of the open structure may protrude toward the shielding mold, and the top portion of the open structure and the shielding mold may collectively define a same planar surface.

According to an embodiment, the bottom portion 432 of the open structure 430 may extend inward toward the second component, and the bottom portion of the open structure may be connected to one of the second pads of the circuit board.

According to an embodiment, the electronic device may further include the mechanism 505 disposed on the open structure 430. The ground pad 507 may be disposed on the bottom surface of the mechanism 505, contact the top portion of the open structure, and provide shielding of the second component.

According to an embodiment, the electronic device may further include the thermally conductive member 509 disposed on the open structure 430. The top portion of the open structure may include the first part 431a extending toward the shielding mold and the second part 431b extending in an opposite direction of the first part toward the second component and supporting the thermally conductive member.

According to an embodiment, the electronic device may be a wearable electronic device.

A method of manufacturing a circuit board module in the electronic device 101 according to an embodiment of the disclosure may include a process (process 10) of preparing the circuit board 410, the metal mask 501, and the solder paste 502 and soldering the solder paste on a part of the circuit board, a mounting and reflow process (process 20) of disposing the plurality of components 451 and 452 and the open structure 430 on the circuit board, a full molding process (process 30) of disposing the mold frame 503 on the circuit board and injecting a mold into the mold frame, and a process (process 40) of removing the mold frame.

According to an embodiment, the mounting and reflow process of disposing the plurality of components and the open structure on the circuit board may include disposing the first component 451 on the first area S1 of the circuit board 410 and disposing the second component 452 and the open structure 430 on the second area S2 of the circuit board, and the open structure may be disposed to surround a side surface of the second component.

According to an embodiment, the top portion 431 of the open structure 430 may be opened and expose a part of the second component 451 or the circuit board 410, the inner surface 433b of the open structure 430 may be spaced apart from the second component, and the outer surface 433b of the open structure 430 may be disposed to contact the shielding mold 420.

According to an embodiment, the open structure may be connected to a plurality of pads 412 of the circuit board on the second area, and one pad 412a of the plurality of pads 412 may be connected to the open structure 430 and have a closed-loop shape.

The invention claimed is:

1. An electronic device comprising:
   a housing;
   a circuit board disposed within the housing;
   a first component and a second component disposed on one surface of the circuit board;
   a shielding mold disposed on the one surface of the circuit board to cover top and side surfaces of the first component;
   an open structure disposed on the one surface of the circuit board to surround a side surface of the second component;
   a thermally conductive member disposed on the open structure,
   wherein a top portion of the open structure is opened and exposes a part of the second component or the circuit board,
   an inner surface of the open structure is spaced apart from the second component,
   an outer surface of the open structure contacts the shielding mold, and
   wherein the top portion of the open structure includes a first part extending toward the shielding mold and a second part extending in an opposite direction of the first part and supporting the thermally conductive member.

2. The electronic device of claim 1, wherein the circuit board includes a first area and a second area surrounded by the first area,
   wherein the first component is disposed on the first area, and wherein the second component spaced apart from the first component is disposed on the second area.

3. The electronic device of claim 2, wherein a plurality of first pads is disposed on the first area of the circuit board, and the first component and the plurality of first pads are connected to each other by soldering, and
   wherein a plurality of second pads is disposed on the second area of the circuit board, and the second component and the open structure are connected to the plurality of second pads by soldering.

4. The electronic device of claim 3, wherein one pad of the plurality of second pads is connected to the open structure and has a closed-loop shape.

5. The electronic device of claim 3, wherein a bottom portion of the open structure protrudes in an opposite direction of the top portion, and
   wherein the bottom portion of the open structure is connected to one of the second pads of the circuit board.

6. The electronic device of claim 2, wherein the open structure includes a plurality of sidewalls extending vertically from the top portion and disposed to surround the second component, and
   wherein the plurality of sidewalls has a closed-loop shape disposed along an edge of the second area of the circuit board.

7. The electronic device of claim 6, wherein a bottom surface of each of the plurality of sidewalls is disposed in contact with the circuit board.

8. The electronic device of claim 6, wherein the top portion of the open structure extends outward toward the first component.

9. The electronic device of claim 8, wherein the top portion of the open structure and the sidewalls extending from the top portion have a stepped shape.

10. The electronic device of claim 1, wherein the second component is at least one of a sensor, a global positioning system (GPS), a con to con connector, a clip-type connector, a radio frequency (RF) switch, a passive element (LC) for RF tuning, a recognition mark, a testpoint, a microphone, an embedded subscriber identification module (eSIM), or a steel use stainless (SUS) mechanism.

11. The electronic device of claim 1, wherein a separation space between the inner surface of the open structure and the second component is filled with air.

12. The electronic device of claim 1, wherein the open structure includes a metal material.

13. The electronic device of claim 1, wherein the top portion of the open structure protrudes toward the shielding mold, and a top surface of the top portion of the open structure and a top surface of the shielding mold collectively define a same planar surface.

14. The electronic device of claim 1, further comprising a mechanism disposed on the open structure, wherein a ground pad is disposed on a bottom surface of the mechanism, contacts the top portion of the open structure, and provides shielding of the second component.

15. The electronic device of claim 1, wherein the electronic device is a wearable electronic device.

* * * * *